(12) United States Patent
Lo et al.

(10) Patent No.: US 6,281,578 B1
(45) Date of Patent: Aug. 28, 2001

(54) MULTI-CHIP MODULE PACKAGE STRUCTURE

(75) Inventors: Randy H. Y. Lo, Taipei; Chi-Chuan Wu, Taichung; Han-Ping Pu, Taipei Hsien; Eric Ko, Taichung Hsien, all of (TW)

(73) Assignee: Siliconware Precision Industries, Co., Ltd., Taichung (TW)

( * ) Notice: Subject to any disclaimer, the term of this patent is extended or adjusted under 35 U.S.C. 154(b) by 0 days.

(21) Appl. No.: 09/638,989

(22) Filed: Aug. 15, 2000

(30) Foreign Application Priority Data

Apr. 28, 2000 (TW) ................................................ 89108084

(51) Int. Cl.[7] .............................. H01L 23/34; H01L 23/10
(52) U.S. Cl. ....................... 257/724; 257/707; 257/719; 257/723; 257/725
(58) Field of Search .................................. 257/706, 707, 257/717, 718, 719, 723, 724, 725, 726

(56) References Cited

U.S. PATENT DOCUMENTS 5,053,852   10/1991   Biswas et al. .
5,477,082 * 12/1995   Buckley, III et al. ............... 257/679
5,804,874 *  9/1998   An et al. ................................. 257/676
6,031,279 *  2/2000   Lenz ....................................... 257/686
6,122,171 *  9/2000   Akram et al. ......................... 361/704
6,239,366 *  5/2001   Hsuan et al. ......................... 174/52.3

* cited by examiner

Primary Examiner—Ngân V. Ngô
(74) Attorney, Agent, or Firm—Peter F. Corless; Edwards & Angell, LLP

(57) ABSTRACT

A multi-chip module (MCM) integrated circuit package structure is proposed, which can be used to pack a plurality of semiconductor chips of different functions while nonetheless allowing the overall package size to be as small as some existing types of integrated circuit packages, such as the SO (Small Outline) and QFP (Quad Flat Package) types, so that it can be manufactured using the existing fabrication equipment. The proposed MCM integrated circuit package structure is characterized in the use of a substrate having a centrally-located opening, and at least one semiconductor chip is mounted on the front surface of the substrate and a semiconductor chip of a central-pad type having a plurality of centrally-located bonding pads is mounted on the back surface of the substrate with the centrally-located bonding pads being exposed through the opening. This arrangement allows the overall package size to be made very compact and also allows the wiring to the central-pad type semiconductor chip to be shortened.

9 Claims, 2 Drawing Sheets

MULTI-CHIP MODULE PACKAGE STRUCTURE

BACKGROUND OF THE INVENTION

1. Field of the Invention

This invention relates to integrated circuit (IC) packaging technology, and more particularly, to a multi-chip module (MCM) integrated circuit package structure which can be used to pack a plurality of semiconductor chips of different functions in a single package while nonetheless allowing the overall package size to be as small as some existing types of integrated circuit packages.

2. Description of Related Art

An MCM type of integrated circuit package is designed to pack more than one semiconductor chips, typically of different functions, in a single package module. This allows a single package module to be capable of offering a system level of functionality. For example, a microprocessor chip, an SRAM (Static Random-Access Memory) chip, and a flash memory chip can be packed in the same package module, so that the package module alone can offer the functionality of a microcontroller.

Conventionally, there are many ways to pack a plurality of semiconductor chips of different functions in a single package, including, for example, the U.S. Pat. No. 5,053,852 to Biswas et al., entitled "MOLDED HYBRID IC PACKAGE AND LEAD FRAME THEREFORE". One drawback to this patent, however, is that it is considerably large in size that makes it take a large surface mounting area on the circuit board.

SUMMARY OF THE INVENTION

It is therefore an objective of this invention to provide an MCM integrated circuit package structure, which can pack a plurality of semiconductor chips in a single package while nonetheless allowing the overall package size to be as small as some existing types of integrated circuit packages, so that it can be manufactured using the existing fabrication equipment.

In accordance with the foregoing and other objectives, the invention proposes a new MCM integrated circuit package structure for packing a plurality of semiconductor chips. The MCM integrated circuit package structure of the invention comprises: a substrate having a front surface and a back surface and formed with at least one through opening; a first semiconductor chip mounted on the front surface of the substrate; a second semiconductor chip of a central-pad type having a plurality of centrally-located bonding pads, which is mounted across the opening on the back surface of the substrate with the centrally-located bonding pads being exposed through the opening; electrically coupling means for electrically interconnecting the first semiconductor chip, the second semiconductor chip, and the substrate; a plurality of leads electrically connected to the substrate for external electrically coupling of the first and second semiconductor chips; and an encapsulation body which encapsulates the first semiconductor chip, the second semiconductor chip, and the substrate.

The foregoing MCM integrated circuit package structure can pack a plurality of semiconductor chips of different functions in a single package, while nonetheless allowing the overall package size to be the same as a conventional SO (Small Outline) package or a QFP (Quad Flat Package). Moreover, it also allows the wiring to the central-pad type semiconductor chip to be shortened.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, three preferred embodiments are disclosed in full details in the following with reference to FIGS. 1–2, FIG. 3, and FIG. 4 respectively.

Figure 1:
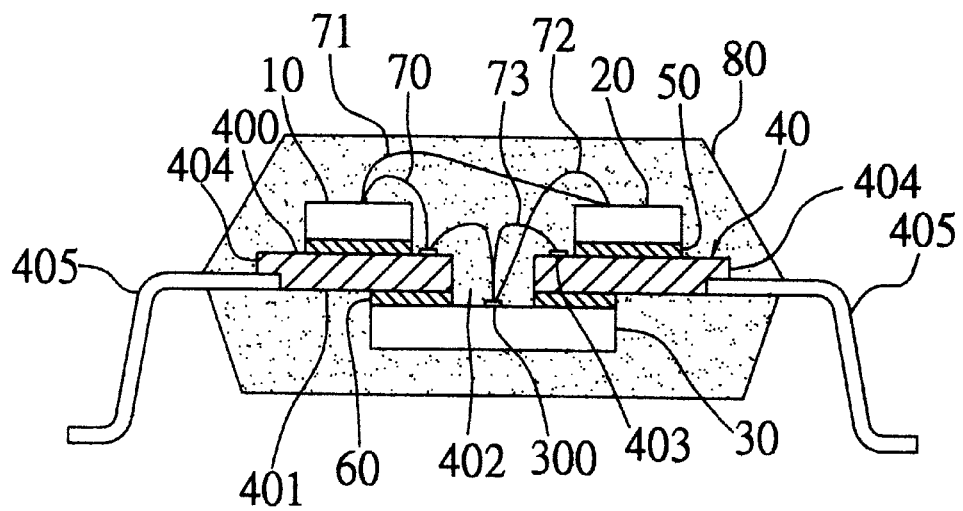
FIG. 1 is a schematic sectional diagram of a first preferred embodiment of the MCM integrated circuit package structure according to the invention.
Figure 2:
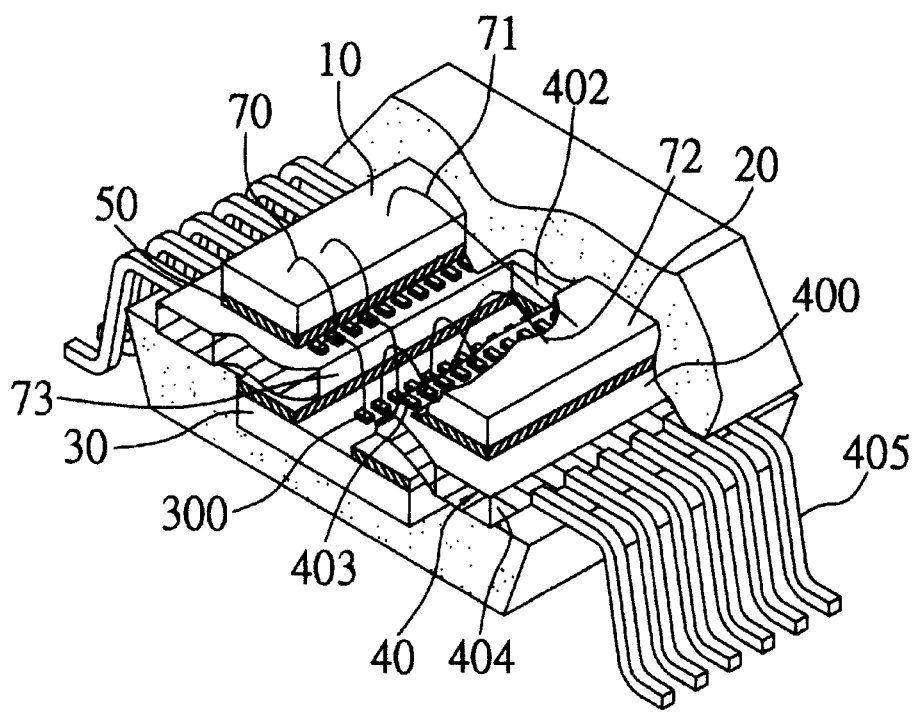
FIG. 2 is a schematic perspective view of the MCM integrated circuit package structure of FIG. 1.

First Preferred Embodiment (FIGS. 1–2)

The first preferred embodiment of the MCM integrated circuit package structure of the invention is disclosed in full details in the following with reference to FIG. 1 and FIG. 2.

It is to be noted that in the terminology of semiconductor technology, the term "chip" is synonymous with the term "die". Moreover, throughout this specification, the term "circuit surface" refers to the front surface of a semiconductor chip where circuit components and bonding pads are formed, while the term "non-circuit surface" refers to the back surface of the semiconductor chip.

In the embodiment of FIGS. 1 and 2, the MCM integrated circuit package structure is used to pack three semiconductor chips including a first semiconductor chip 10, a second semiconductor chip 20, and a third semiconductor chip 30. However, it is to be understood that the number of semiconductor chips packed in the MCM integrated circuit package structure is not limited to three, and can be four or more. Further, it is to be noted that the third semiconductor chip 30 should be a central pad type whose bonding pads 31 are arranged along a central line on the circuit surface thereof In this embodiment, for example, the first semiconductor chip 10 is a microcontroller, the second semiconductor chip 20 is an SRAM device; and the third semiconductor chip 30 is a flash memory device.

The MCM integrated circuit package structure of the invention includes the use of a substrate 40 having a front surface 400 and a back surface 401 and is formed with a square opening 402. The front surface 400 of the substrate 40 is formed with a plurality of electrically-conductive traces (not shown) whose terminating ends are connected to a plurality of bonding pads 403. The first semiconductor chip 10 and the second semiconductor chip 20 are adhered by means of an adhesive agent 50 such as silver glue on the front surface 400 of the substrate 40 on both sides of the opening 402. Further, the third semiconductor chip 30 is adhered by means of an adhesive agent 60 such as silver glue to the back surface 401 of the substrate 40 in such a manner as to allow the centrally-located bonding pads 300 on the circuit surface of the third semiconductor chip 30 to be exposed through the opening 402. This arrangement allows the assembly of the three semiconductor chips 10, 20, 30 to be compact in size, only slightly larger than a single-chip package.

Further, the substrate 40 is formed with a plurality of leads 405 on the periphery 404 thereof, which are electrically connected to the electrically-conductive traces (not shown) on the front surface 400 of the substrate 40. These leads 405 allow the three semiconductor chips 10, 20, 30 to be electrically coupled to external circuitry such as a printed circuit board (not shown).

Next, a wire-bonding process is performed to interconnect a plurality of sets of bonding wires 70, 71, 72, 73 among the three semiconductor chips 10, 20, 30 and the substrate 40, including a first set of bonding wires 70 for electrically coupling the first semiconductor chip 10 to the substrate 40; a second set of bonding wires 71 for electrically coupling the first semiconductor chip 10 to the second semiconductor chip 20; a third set of bonding wires 72 for electrically coupling the second semiconductor chip 20 to the third semiconductor chip 30; and a fourth set of bonding wires 73 for electrically coupling the third semiconductor chip 30 to the substrate 40. Since the three semiconductor chips 10, 20, 30 and the substrate 40 are all arranged with the front surfaces thereof facing upwards, the wire-bonding process can be finished in one pass without having to turn the substrate 40 upside down. Moreover, since the fourth set of bonding wires 73 are wired through the opening 402 to the centrally-located bonding pads 300 on the third semiconductor chip 30, they can be made shorter to help reduce the signal transmission path between the third semiconductor chip 30 and the substrate 40, thereby enhancing performance and reliability in signal transmission.

Finally, an encapsulation process is performed to form an encapsulation body 80 to encapsulate the three semiconductor chips 10, 20, 30, the substrate 40, the bonding wires 70, 71, 72, 73, and the inner part of the leads 405, while exposing the outer part of the leads 405 to allow external coupling of the three semiconductor chips 10, 20, 30 through surface mount technology (SMT) to a printed circuit board (not shown). This completes the assembly of the MCM integrated circuit package structure of the invention.

Figure 3:
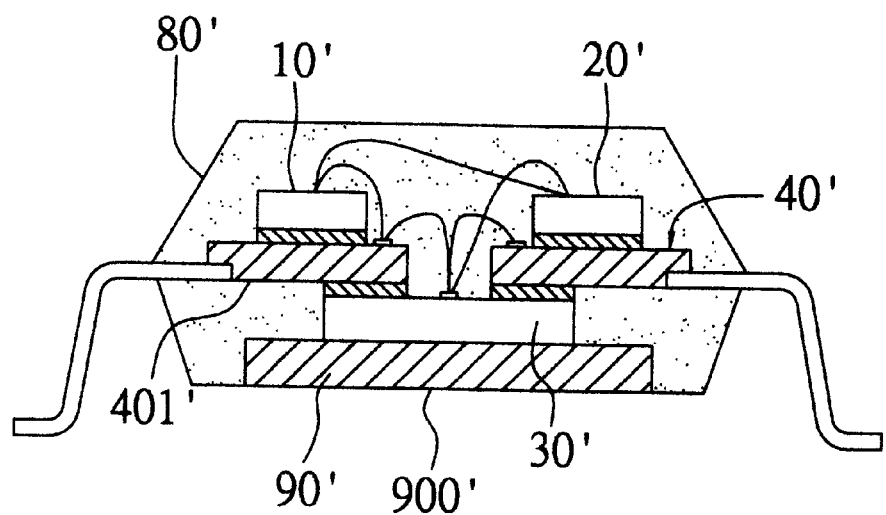
FIG. 3 is a schematic sectional diagram of a second preferred embodiment of the MCM integrated circuit package structure according to the invention.

Second Preferred Embodiment (FIG. 3)

The second preferred embodiment of the MCM integrated circuit package structure of the invention is disclosed in full details in the following with reference to FIG. 3. In FIG. 3, the same parts as the previous embodiment are labeled with the same reference numerals appended with a prime mark.

This preferred embodiment is substantially the same as the previous one except that it is further included with a heat sink 90' attached to the noncircuit surface of the third semiconductor chip 30'. This heat sink 90' is assembled to the third semiconductor chip 30' prior to the encapsulation process; and after the encapsulation process, the bottom surface 900' of the heat sink 90' is exposed to the outside of the encapsulation body 80' so that the heat sink 90' can come in touch with the atmosphere. This allows the chip-produced heat during operation to be dissipated through the heat sink 90' to the atmosphere, providing an increased heat-dissipation efficiency as compared to the previous embodiment.

Figure 4:
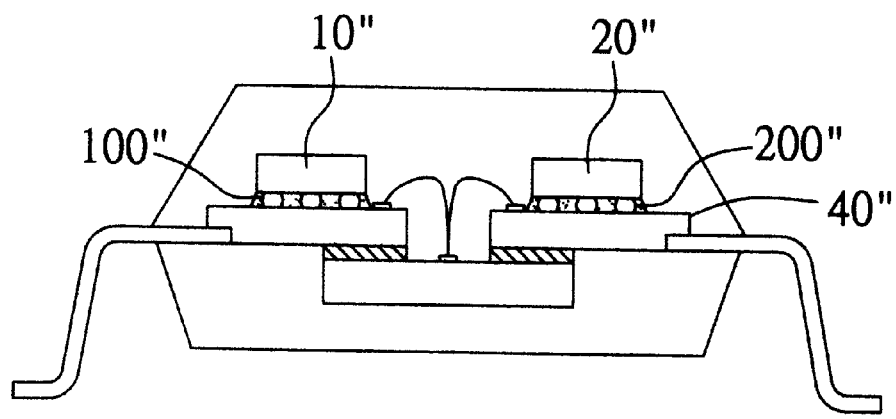
FIG. 4 is a schematic sectional diagram of a third preferred embodiment of the MCM integrated circuit package structure according to the invention.

Third Preferred Embodiment (FIG. 4)

The third preferred embodiment of the MCM integrated circuit package structure of the invention is disclosed in full details in the following with reference to FIG. 4. In FIG. 4, the same parts as the previous embodiments are labeled with the same reference numerals appended with a double-prime mark.

This preferred embodiment is substantially the same as the previous ones except that the first semiconductor chip 10" is electrically coupled to the substrate 40" by means of solder bumps 100" through flip-chip technology; and similarly, the second semiconductor chip 20" is electrically coupled to the substrate 40" by means of solder bumps 200" through flip-chip technology. Compared to the previous embodiments, this one allows the wiring in the package to be less complicated.

In conclusion, the invention provides a new MCM integrated circuit package structure which can be used pack a plurality of semiconductor chips of different functions in a single package, while nonetheless allowing the overall package size to be as small as some existing types of integrated circuit packages, such as the SO (Small Outline) and QFP (Quad Flat Package) types, so that the manufacture for the MCM integrated circuit package structure of the invention can be implemented using existing fabrication equipment for SO and QFP. This benefit allows the overall manufacture process, including packaging, testing, and surface mounting, to be convenient and cost-effective to carry out.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An MCM integrated circuit package structure, which comprises:

a substrate having a front surface and a back surface and formed with at least one through opening;

a first semiconductor chip mounted on the front surface of the substrate;

a second semiconductor chip of a central-pad type having a plurality of centrally-located bonding pads, which is mounted across the opening on the back surface of the substrate with the centrally-located bonding pads being exposed through the opening;

electrically coupling means for electrically interconnecting the first semiconductor chip, the second semiconductor chip, and the substrate;

a plurality of leads electrically connected to the substrate for external electrically coupling of the first and second semiconductor chips; and an encapsulation body which encapsulates the first semiconductor chip, the second semiconductor chip, and the substrate.

2. The MCM integrated circuit package structure of claim 1, further comprising:

a heat sink having a first surface attached to the second semiconductor chip and a second surface exposed to the outside of the encapsulation body.

3. The MCM integrated circuit package structure of claim 1, wherein the first semiconductor chip is a microcontroller.

4. The MCM integrated circuit package structure of claim 1, wherein the first semiconductor chip is an SRAM device.

5. The MCM integrated circuit package structure of claim 1, wherein the first semiconductor chip is a flash memory device.

6. The MCM integrated circuit package structure of claim 1, wherein the leads have an outer part exposed to the outside of the encapsulation body.

7. The MCM integrated circuit package structure of claim 1, wherein the electrically coupling means comprises gold wires.

8. The MCM integrated circuit package structure of claim 1, wherein the electrically coupling means comprises solder bumps.

9. The MCM integrated circuit package structure of claim 1, wherein the substrate comprises electrically-conductive traces on the front surface thereof.

* * * * *